(12) United States Patent
Wu et al.

(10) Patent No.: US 6,482,691 B2
(45) Date of Patent: *Nov. 19, 2002

(54) SEISMIC IMAGING USING OMNI-AZIMUTH SEISMIC ENERGY SOURCES AND DIRECTIONAL SENSING

(75) Inventors: Zhiqiang Wu, Dallas, TX (US); Paul Hatab, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 72 days.

(21) Appl. No.: 09/494,974

(22) Filed: Jan. 31, 2000

(65) Prior Publication Data

US 2002/0025620 A1 Feb. 28, 2002

Related U.S. Application Data

(62) Division of application No. 08/968,085, filed on Nov. 12, 1997, now Pat. No. 6,025,232.

(51) Int. Cl.[7] .......................................... H01L 21/8238
(52) U.S. Cl. ...................... 438/217; 438/305; 438/289; 257/408
(58) Field of Search .............................. 438/197, 217, 438/305, 174, 278, 276, 289; 257/145, 220, 335, 344, 345, 403, 408, 303, 305, 307

(56) References Cited

U.S. PATENT DOCUMENTS 4,612,258 A    9/1986   Tsang
4,649,629 A  * 3/1987   Miller et al. ................. 438/130
4,771,014 A    9/1988   Liou et al. ................... 438/217
5,171,700 A   12/1992   Zamanian .................... 438/305

(List continued on next page.)

FOREIGN PATENT DOCUMENTS

JP          9-135022     5/1997    ........... H01L/29/78

OTHER PUBLICATIONS

Silicon Processing For The VLSI Era; vol. 3: The Submicron Mosfet; Stanley Wolf, Ph.D.; 1986; pp. 290, 309–311.
Wolf, S., Silicon Processing for the VLSI Era, vol. 3—The Submicron MOSFET, Lattice Press ©1995, pp. 232–242.
Wolf et al., Silicon Processing for the VLSI Era: vol. 1—Processing Technology, Lattice Press 1986, p. 323.

Primary Examiner—Long Pham
Assistant Examiner—William David Coleman
(74) Attorney, Agent, or Firm—Wells St. John P.S.

(57) ABSTRACT

Methods of forming field effect transistors and related field effect transistor constructions are described. A masking layer is formed over a semiconductive substrate and an opening having sidewalls is formed therethrough. The opening defines a substrate area over which a field effect transistor gate is to be formed. A dopant of a first conductivity type is provided through the opening and into the substrate. Sidewall spacers are formed over respective sidewaUs of the opening. Enhancement dopant of a second conductivity type which is different from the first conductivity type is provided through the opening and into the substrate. A transistor gate is formed within the opening proximate the sidewall spacers, and source/drain regions of the second conductivity type are diffused into the substrate operably proximate the transistor gate. The first conductivity type dopant forms a halo region proximate the source/drain regions and lightly doped drain (LDD) regions for the transistor.

17 Claims, 6 Drawing Sheets

U.S. PATENT DOCUMENTS

| | | | |
|---|---|---|---|
| 5,235,204 A | 8/1993 | Tsai | |
| 5,434,093 A | 7/1995 | Chau et al. | 438/300 |
| 5,463,237 A | 10/1995 | Funaki | |
| 5,534,447 A * | 7/1996 | Hong | 438/305 |
| 5,538,913 A | 7/1996 | Hong | 438/282 |
| 5,548,143 A | 8/1996 | Lee | 257/269 |
| 5,576,574 A * | 11/1996 | Hong | 257/408 |
| 5,595,919 A * | 1/1997 | Pan | 438/307 |
| 5,605,855 A | 2/1997 | Chang et al. | 438/291 |
| 5,643,815 A | 7/1997 | Vu et al. | |
| 5,658,811 A | 8/1997 | Kimura et al. | 438/289 |
| 5,670,397 A * | 9/1997 | Chang et al. | 438/305 |
| 5,688,700 A | 11/1997 | Kao et al. | 438/289 |
| 5,698,461 A | 12/1997 | Liu | |
| 5,712,501 A * | 1/1998 | Davies et al. | 257/335 |
| 5,736,446 A * | 4/1998 | Wu | 438/305 |
| 5,747,356 A | 5/1998 | Lee et al. | |
| 5,766,998 A | 6/1998 | Tseng | |
| 5,773,348 A * | 6/1998 | Wu | 438/305 |
| 5,773,863 A | 6/1998 | Burr et al. | 257/344 |
| 5,849,615 A | 12/1998 | Ahmad et al. | 438/231 |
| 5,854,135 A | 12/1998 | Ko | |
| 5,893,740 A | 4/1999 | Chang et al. | 438/289 |
| 5,899,719 A * | 5/1999 | Hong | 438/289 |
| 5,899,732 A | 5/1999 | Gardner et al. | 438/473 |
| 5,917,219 A | 6/1999 | Nandakumar et al. | 257/348 |
| 5,930,615 A | 7/1999 | Manning | 438/232 |
| 6,025,232 A | 2/2000 | Wu et al. | 438/270 |
| 6,025,235 A | 2/2000 | Krivokapic | 438/289 |
| 6,025,635 A * | 2/2000 | Krivokapic | 257/412 |
| 6,063,677 A | 5/2000 | Rodder et al. | 438/300 |
| 6,078,086 A * | 6/2000 | Park | 257/386 |
| 6,114,211 A * | 9/2000 | Fulford et al. | 438/305 |
| 6,121,089 A | 9/2000 | Zeng et al. | |
| 6,127,700 A | 10/2000 | Bulucea | |
| 6,146,953 A * | 11/2000 | Lee et al. | 438/289 |
| 6,147,383 A | 11/2000 | Kuroda | 257/344 |
| 6,163,053 A * | 12/2000 | Kawashima | 257/335 |
| 6,169,315 B1 * | 1/2001 | Son | 257/408 |
| 6,177,336 B1 | 1/2001 | Lin et al. | |
| 6,287,990 B1 | 9/2001 | Cheung et al. | 438/780 |

* cited by examiner

SEISMIC IMAGING USING OMNI-AZIMUTH SEISMIC ENERGY SOURCES AND DIRECTIONAL SENSING

This is a divisional application of U.S. patent application Ser. No. 08/968,085, filed Nov. 12, 1997, entitled "Methods of Forming Field Effect Transistors and Related Field Effect Transistor Constructions", naming Zhiqiang Wu and Paul Hatab as inventors, now U.S. Pat. No. 6,025,232, which is incorporated by reference.

TECHNICAL FIELD

This application relates to methods of forming field effect transistors and related field effect transistor constructions.

BACKGROUND OF THE INVENTION

Transistors find use in a wide range of integrated circuits. One type of transistor is the metal-oxide-semiconductor field effect transistor or MOSFET. Typical MOSFETs include source/drain diffusion regions which are disposed within a substrate and a conductive gate which overlies a channel region intermediate the source/drain diffusion regions. In some MOSFETs, placement of a desired voltage on the conductive gate enables a channel to be formed between the source/drain diffusion regions. With the channel being formed, current can be made to flow between the source and the drain. There are a number of different types of MOSFETs such as NMOS and PMOS field effect transistors.

NMOS field effect transistors are typically formed on a p-type substrate or p-well. The channel in an NMOS transistor is usually formed through provision of a positive gate voltage on the transistor which attracts minority electrons within the p-type substrate into the channel region. PMOS field effect transistors are typically formed on an n-type substrate or n-well. The channel in PMOS transistors is typically formed through provision of a negative gate voltage on the transistor gate which attracts minority holes from the n-type substrate into the channel region to form the channel. CMOS (Complementary Metal Oxide Semiconductor) devices utilize both NMOS and PMOS transistors.

An important parameter in MOS transistor is the threshold voltage $V_t$, which is the minimum gate voltage required to induce the channel. In general, the positive gate voltage of an n-channel device (NMOS) must be larger than some value $V_t$ before a conducting channel is induced. Similarly, a p-channel device (PMOS) requires a gate voltage which is more negative than some threshold value to induce the required positive charge in the channel. A valuable tool for controlling threshold voltage is ion implantation. Because very precise quantities of impurity can be introduced into the substrate by this method, it is possible to maintain close control of $V_t$. For example, introduction of a p-type impurity into a p-channel PMOS device can make $V_t$ less negative. This is because the channel region is made more p-type and therefor a lower magnitude of negative voltage is required to induce holes within the channel region.

As MOS transistors are made smaller and smaller, they become susceptible to so-called short channel effects. Short channel effects can be divided into (a) those that impact $V_t$, (b) those that impact subthreshold currents, and (c) those that impact I-V behavior beyond threshold. Short channel effects include punch through which normally occurs as a result of the widening of the drain depletion region when the reverse-bias voltage on the drain is increased. The electric field of the drain may eventually penetrate into the source region and thereby reduce the potential energy barrier of the source-to-body junction. When this occurs, more majority carriers in the source region have enough energy to overcome the barrier, and an increased current then flows from the source to the body, some of which is collected by the drain. One way of reducing the electric field of the drain and hence the risk of punch through is to form so-called halo regions proximate the source/drain regions of a transistor. Halo regions are described in more detail in the texts which are incorporated by reference below.

One type of MOS transistor is a buried channel PMOS. Buried channel PMOS transistors typically have a p– diffusion region disposed within the substrate underneath the gate and between the source/drain diffusion regions. The elevational thickness of the p– diffusion region within the substrate is referred to as gamma-j. One goal in the design of buried channel PMOS transistors is to reduce gamma-j to improve control over current leakage. It is also desirable to provide the p-region as close to the gate as possible to provide for more gate control.

For a more detailed treatment of short channel effects and other relevant semiconductor processing concerns, the reader is referred to two texts: Wolf, *Silicon Processing for the VLSI Era*, Volume 2, Chapters 5 and 6; and Streetman, *Solid State Electronic Devices*, Fourth Edition, both of which are expressly incorporated by reference herein.

This invention arose out of concerns associated with improving the methodology through which MOS devices are fabricated, and improving the resultant MOS structures.

SUMMARY OF THE INVENTION

Methods of forming field effect transistors and related field effect transistor constructions are described. A masking layer is formed over a semiconductive substrate and an opening having sidewalls is formed therethrough. The opening defines a substrate area over which a field effect transistor gate is to be formed. A dopant of a first conductivity type is provided through the opening and into the substrate. Sidewall spacers are formed over respective sidewalls of the opening. Enhancement dopant of a second conductivity type which is different from the first conductivity type is provided through the opening and is into the substrate. A transistor gate is formed within the opening proximate the sidewall spacers, and source/drain regions of the second conductivity type are provided into the substrate operably proximate the transistor gate. The first conductivity type dopant forms a halo region proximate the source/drain regions and lightly doped drain (LDD) regions for the transistor.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws to promote the progress of science and useful arts (Article 1, Section 8).

Figure 1:
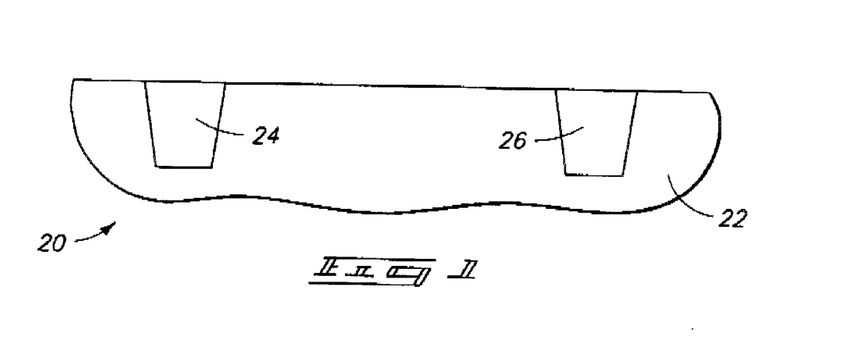
FIG. 1 is a diagrammatic sectional view of a semiconductor wafer fragment undergoing processing in accordance with one embodiment of the present invention.

Referring to FIG. 1, a semiconductor wafer fragment in process is shown generally at 20 and includes semiconductive substrate 22. Substrate 22 comprises a first conductivity type which is preferably n-type. Such substrate can constitute an n-well which is suitable for use in forming CMOS circuitry. A pair of isolation oxide regions 24, 26 are received within substrate 22 and define therebetween an active area within which a transistor is to be formed. In the illustrated example, regions 24, 26 are formed through shallow trench isolation techniques.

Figure 2:
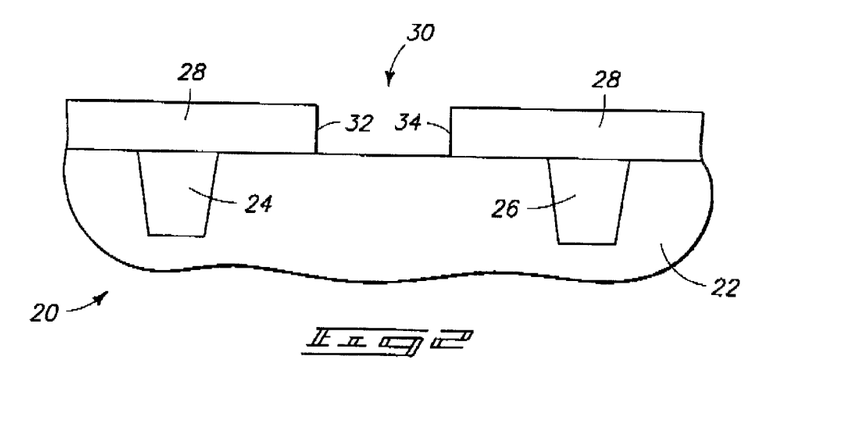
FIG. 2 is a view of the FIG. 1 wafer fragment at a different processing step.

Referring to FIG. 2, a masking layer 28 is formed over substrate 22. An exemplary material for layer 28 is oxide such as that formed through decomposition of tetraethylorthosilicate (TEOS). A first opening 30 is formed through masking layer 28 and defines a substrate area over and within which a field effect transistor gate and channel region respectively are to be formed. The opening includes a pair of sidewalls 32, 34 which face one another.

Figure 3:
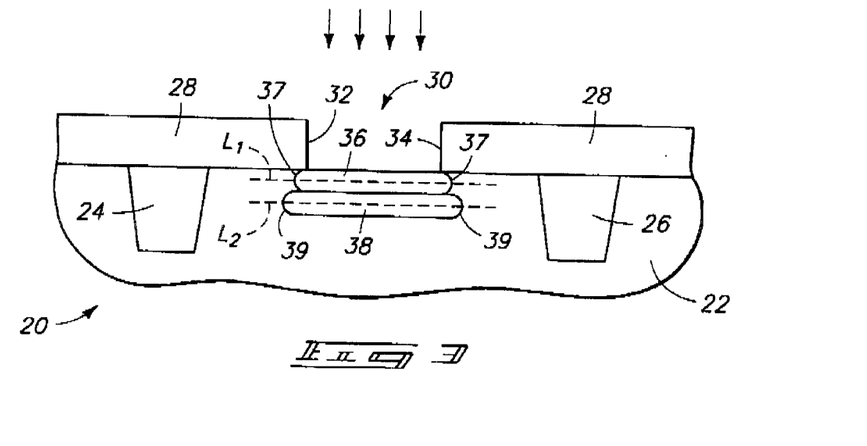
FIG. 3 is a view of the FIG. 1 wafer fragment at a different processing step.

Referring to FIG. 3, dopant comprising the first conductivity type, e.g., n-type, is provided through opening 30 and into substrate 22. In the illustrated example the dopant is provided through multiple doping steps and comprises a first dopant 36 and a second dopant 38. First dopant 36 is implanted into substrate 22 at a first energy level or acceleration voltage and defines a first average elevational dopant level $L_1$ within the substrate. Second dopant 38 is implanted into the substrate through a second implant conducted at a second energy level or acceleration voltage which is different from the first energy. Accordingly, a second average elevational dopant level $L_2$ is defined within substrate 22 which is different from first level $L_1$. In the illustrated example, the first energy which is utilized to implant first dopant 36 is lower than the second energy which is utilized to implant dopant 38. First dopant 36 comprises dopant or impurity which will ultimately form lightly doped drain regions of a transistor; and second dopant or impurity 38 comprises dopant which will ultimately provide halo doping regions for the transistor. Exemplary first and second dopants comprise arsenic and phosphorus respectively.

An exemplary energy or accelerating voltage for first dopant 36 is about 50 keV; although a range from between about 10–70 keV is sufficient. An exemplary dose for first dopant 36 is about $3.5\times10^{12}$ cm$^{-2}$; although a range from between about $1\times10^{12}$ cm$^{-2}$ to $5\times10^{12}$ cm$^{-2}$ is sufficient. An exemplary second energy or accelerating voltage for second dopant 38 is about 100 keV; although a range from between about 50–200 keV would be sufficient. An exemplary dose is about $5\times10^{12}$ cm$^{-2}$; although a dose from between $2\times10^{12}$ cm$^{-2}$ to $1\times10^{13}$ cm$^{-2}$ would be sufficient. First and second dopants 36, 38 include respective portions 37, 39 which extend outwardly of the substrate area within which the channel region is to be formed. Alternatively, dopant of the first conductivity type can be provided into substrate 22 through an angled ion implant which is conducted at a suitable angle away from vertical to at least form portions 37 outwardly of the area in which the channel region is to be formed.

Figure 4:
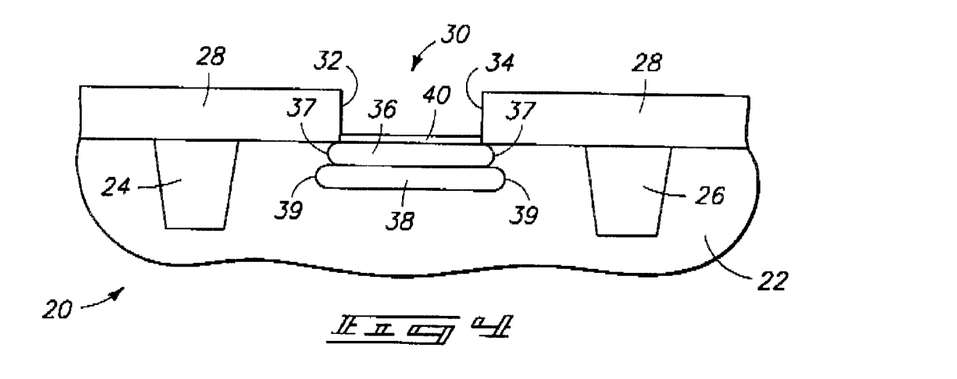
FIG. 4 is a view of the FIG. 1 wafer fragment at a different processing step.

Referring to FIG. 4, an optional sacrificial oxide layer 40 can be formed over substrate 22 within opening 30. An exemplary thickness for layer 40 is around 90 Angstroms. Additionally, such layer can be formed prior to provision of first and second dopants 36, 38.

Figure 5:
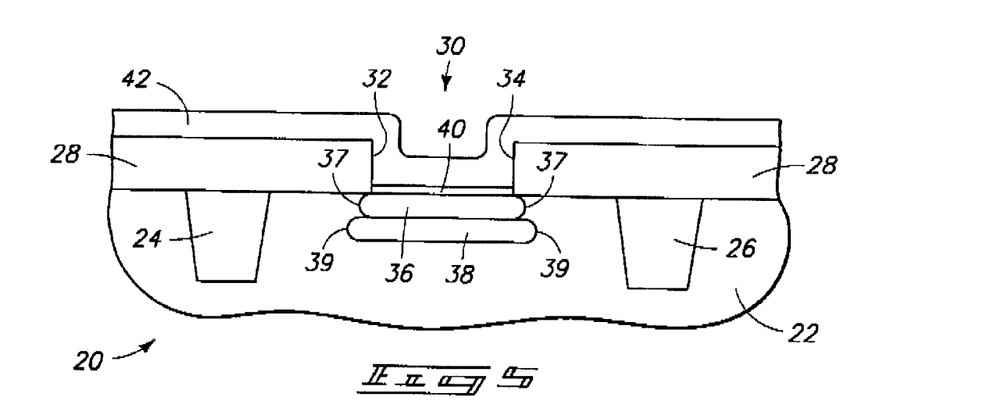
FIG. 5 is a view of the FIG. 1 wafer fragment at a different processing step.

Referring to FIG. 5, a layer 42 comprising an insulative material is formed over substrate 22 within opening 30 and over sacrificial oxide layer 40. An exemplary material for layer 42 comprises a suitable nitride material. Layer 42 can also comprise material which ultimately forms a conductive portion of a transistor gate. An exemplary material is polysilicon.

Figure 6:
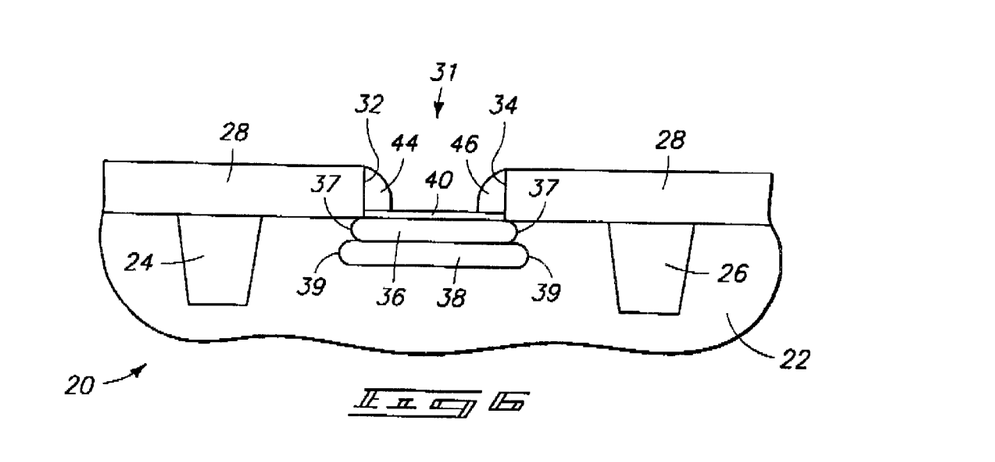
FIG. 6 is a view of the FIG. 1 wafer fragment at a different processing step.

Referring to FIG. 6, layer 42 is selectively etched relative to sacrificial oxide layer 40 to form sidewall spacers 44, 46 over sidewalls 32, 34 respectively. Sidewall spacers 44, 46 define a second opening 31 which is smaller in dimension than first opening 30.

Figure 7:
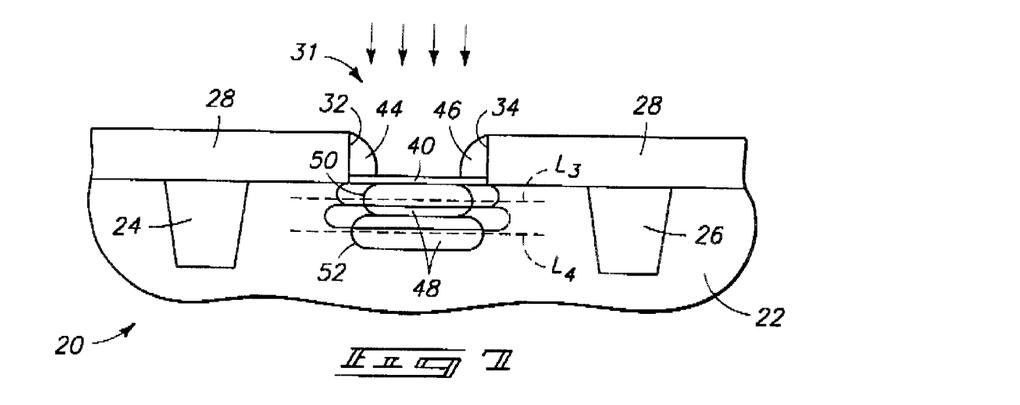
FIG. 7 is a view of the FIG. 1 wafer fragment at a different processing step.

Referring to FIG. 7, third dopant 48 of a second conductivity type is provided through opening 30 and into substrate 22. In the illustrated example, third dopant 48 defines third average elevational dopant levels $L_3$, $L_4$ within substrate 22 which can be different from first and second average elevational dopant levels $L_1$, $L_2$. Third dopant 48 comprises p-type dopant at least a portion of which is an enhancement dopant to compensate for n-type arsenic which is disposed within the channel region. At least some of third dopant 48 is provided inwardly of substrate portions over which sidewalls 44, 46 are disposed.

In the illustrated example, third dopant 48 comprises two doped regions 50, 52. An exemplary dopant for doped region 50 comprises $BF_2$ which is provided into substrate 22 at an energy or acceleration voltage of about 25 keV; although a range from between about 10–35 keV will suffice. An exemplary dose for the $BF_2$ dopant is about $8\times10^{12}$ cm$^{-2}$; although doses from between about $3\times10^{12}$ cm$^{-2}$ to $2\times10^{13}$ cm$^{-2}$ will suffice. An exemplary material for doped region 52 comprises boron which is provided at an energy or acceleration voltage of about 18 keV; although energies from between about 5–25 keV will suffice. An exemplary dose for the boron is about $5\times10^{12}$ cm$^{-2}$; although a range from between $2\times10^{12}$ cm$^{-2}$ to $1\times10^{13}$ cm$^{-2}$ will suffice.

Figure 8:
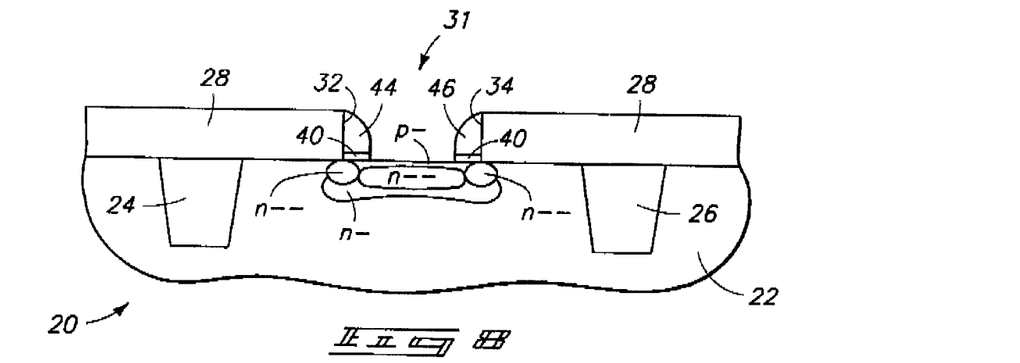
FIG. 8 is a view of the FIG. 1 wafer fragment at a different processing step.

Referring to FIG. 8, sacrificial oxide layer 40 between sidewall spacers 44, 46 is removed. FIG. 8 also shows a resultant doping profile within the substrate as a result of the doping steps described above.

Figure 9:
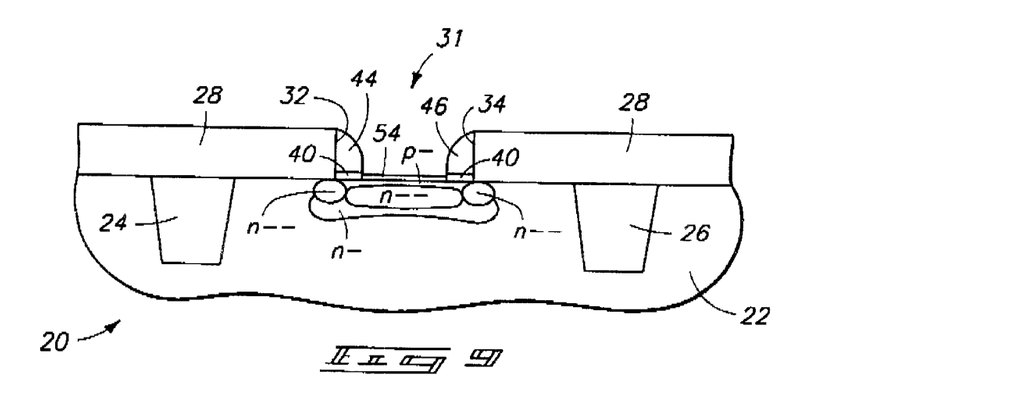
FIG. 9 is a view of the FIG. 1 wafer fragment at a different processing step.

Referring to FIG. 9, a gate oxide layer 54 is formed over substrate 22 and between sidewall spacers 44, 46.

Figure 10:
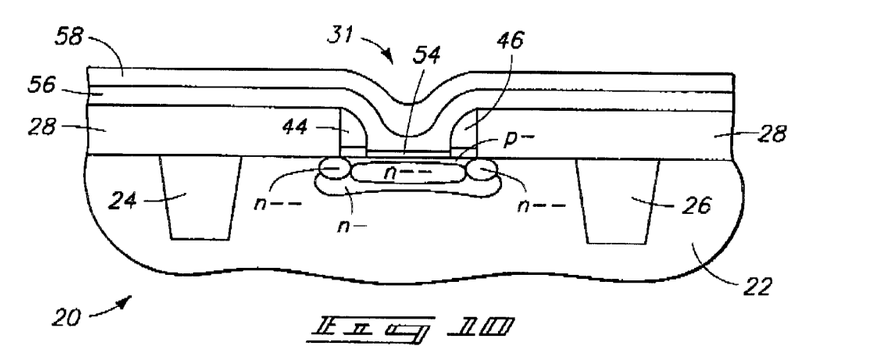
FIG. 10 is a view of the FIG. 1 wafer fragment at a different processing step.

Referring to FIG. 10, a conductive layer 56 is formed over substrate 22 and between sidewall spacers 44, 46. An exemplary material comprises conductively-doped polysilicon which defines a transistor gate layer. A refractory metal layer can be formed over substrate 22 and reacted with layer 56 to form a silicide layer 58 over transistor gate layer 56.

Figure 11:
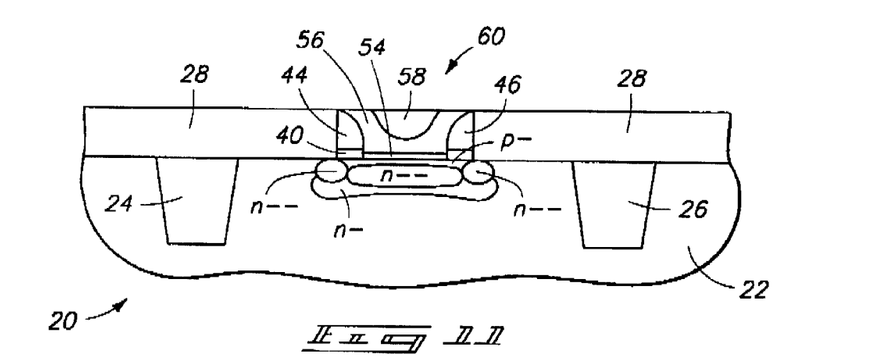
FIG. 11 is a view of the FIG. 1 wafer fragment at a different processing step.

Referring to FIG. 11, layers 56, 58 are planarized relative to masking layer 28 to form a transistor gate 60. An exemplary planarization technique comprises mechanical abrasion as by chemical-mechanical polishing. Transistor gate 60 is formed within opening 30 proximate or adjacent sidewall spacers 44, 46 and is formed over the channel region. The transistor gate can, however, be formed prior to formation of sidewall spacers 44, 46.

Figure 12:
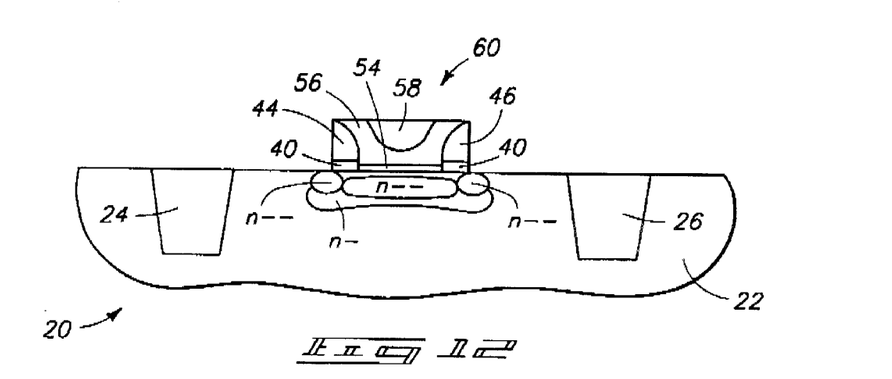
FIG. 12 is a view of the FIG. 1 wafer fragment at a different processing step.

Referring to FIG. 12, masking layer 28 is stripped or otherwise removed to outwardly expose transistor gate 60.

Figure 13:
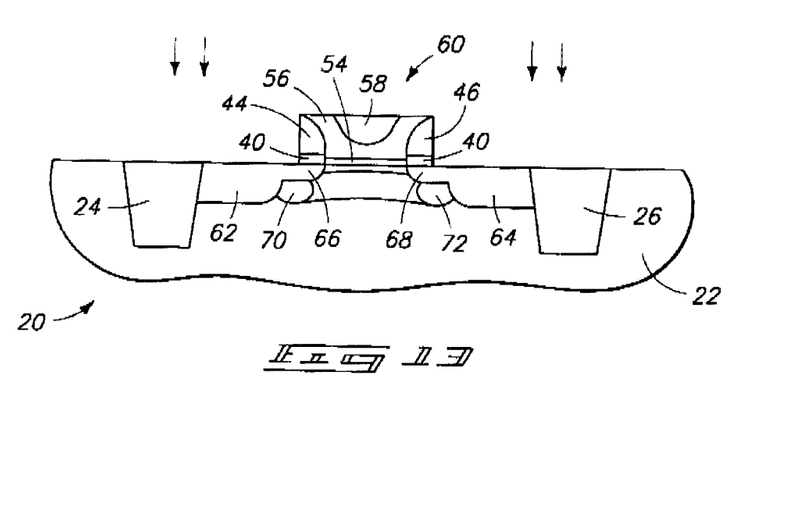
FIG. 13 is a view of the FIG. 1 wafer fragment at a different processing step.

Referring to FIG. 13, source/drain diffusion regions 62, 64 are formed by providing impurity of the second conductivity type, e.g., p-type, into substrate 22. Accordingly, the impurity is disposed proximate transistor gate 60 and on either side thereof. Diffusion regions 62, 64 are also disposed operably proximate the halo doping impurity and lightly doped drain impurity which was previously provided. An exemplary p-type impurity is $BF_2$ which can be provided into the substrate at an energy or accelerating voltage of about 20 keV; although a range from between about 5–30 keV is sufficient. An exemplary dose is about $2 \times 10^{15}$ cm$^{-2}$; although a range from between about $5 \times 10^{14}$ cm$^{-2}$ to $4 \times 10^{15}$ cm$^{-2}$ will suffice. Subsequently, the substrate can be annealed sufficiently to diffuse the provided impurity within the substrate and form lightly doped drain regions 66, 68 and halo regions 70, 72 operably proximate source/drain diffusion regions 62, 64. Specifically, during the annealing of the substrate, some p-type source/drain dopant diffuses laterally outwardly and into a substrate portion having the illustrated n-- and n- regions (FIG. 12). The net result of the diffusion between the p-type dopant and the n-- and n- dopant is a compensation effect in which p- LDD regions 66, 68, and n- halo regions 70, 72 are formed. Exemplary temperature and time conditions for annealing the substrate are about 875° C. for a duration of around 40 minutes. Optionally, prior to the provision of the source/drain regions, sidewall spacers can be formed over spacers 44, 46 respectively.

Figure 14:
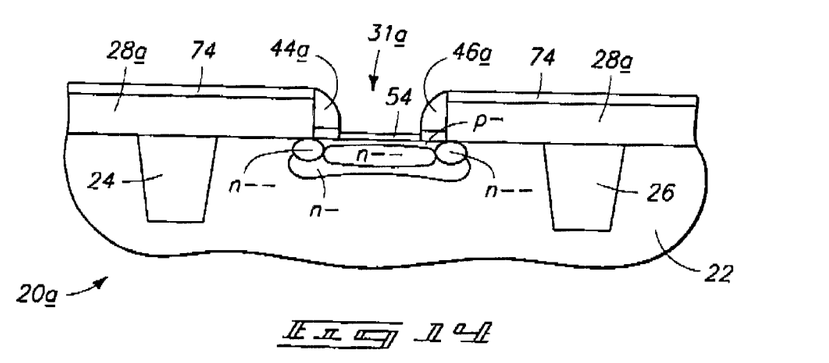
FIG. 14 is a view of a wafer fragment undergoing processing in accordance with an alternate embodiment of the present invention.
Figure 15:
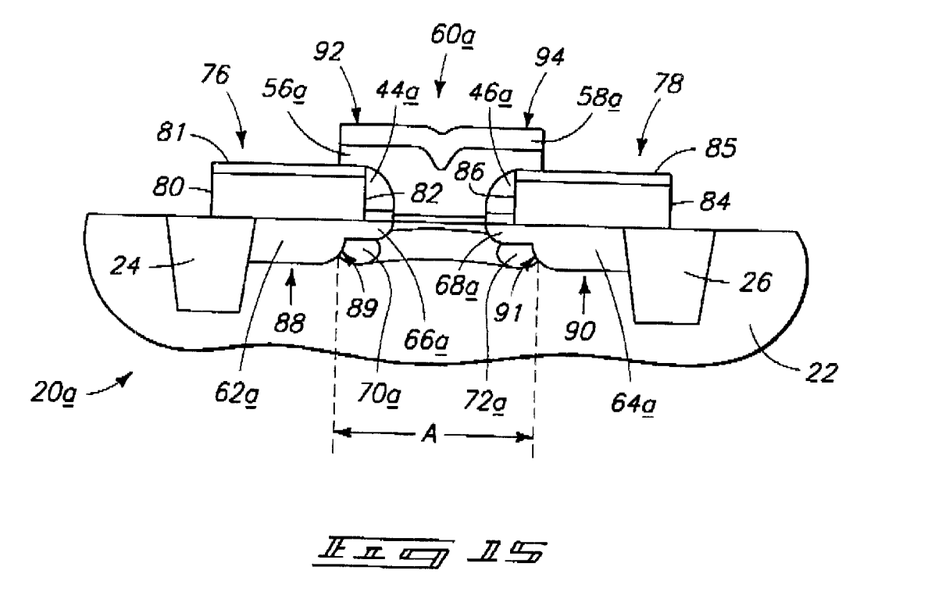
FIG. 15 is a view of the FIG. 14 wafer fragment at a different processing step.

Referring to FIGS. 14–16, an alternate embodiment is described. Like numbers from the above-described embodiment have been utilized where appropriate with differences being indicated by the suffix "a" or with different numerals. Accordingly, a masking layer 28a is formed over substrate 22 and comprises polysilicon which is doped with a p-type impurity. A layer 74 is formed over masking layer 28a and comprises an insulative material such as an oxide. An opening 31a is provided through layers 28a and 74 and is defined in part by sidewall spacers 44a, 46a.

Referring to FIG. 15, a transistor gate layer 56a and a silicide layer 58a are formed. over substrate 22 and within opening 31a. Layers 56a, 58a are sufficiently etched to leave at least some material of the layers overlapping with masking layer 28a.

Portions of masking layer 28a and layer 74 which are disposed laterally outwardly of opening 31a are removed to leave behind a pair of spaced-apart blocks 76, 78. The portions of masking layer 28a which are removed comprise portions which are not overlapped with conductive material of transistor gate 60a. Substrate 22 is exposed to conditions which are effective to out diffuse p-type dopant from masking layer 28a into the substrate. Accordingly, such out diffusion forms source/drain diffusion regions 62a, 64a, respectively.

Individual blocks 76, 78 have respective outwardly facing sidewalls 80, 82, and 84, 86. A generally planar block top 81 extends between sidewalls 80, 82; and a generally planar block top 85 extends between sidewalls 84, 86. Sidewalls 82, 86 face one another and define an opening which corresponds to first opening 30. Sidewall spacers 44a, 46a are disposed over respective sidewalls 82, 86 and define a second opening 31a. Source/drain diffusion regions 62a, 64a are received within substrate 22 beneath blocks 76, 78 respectively, and comprise individual bottommost portions 88, 90. The diffusion regions also comprise respective side portions 89, 91 which are joined with the respective bottommost portions and face one another. In the illustrated example, side portions 89, 91 define an area A therebetween and halo regions 70a, 72a are joined with respective side portions 89, 91 and are disposed entirely with area A. Transistor gate 60a includes a pair of extensions 92, 94 which are disposed over block 76, 78 respectively. Silicide layer 58a includes portions which are disposed over the extensions and comprise a portion thereof.

The above-described methodologies and structures provide reliable lightly doped drain regions and punch through implants, especially for buried channel PMOS transistors. Lower source/drain junction capacitances are provided which increases the transistor's operating speed. The ability to provide compensated lightly doped drain regions provides increased control over the overlap between the gate and the p+ source/drain diffusion regions. Improved control over leakage current is provided by having a shallow gamma-j parameter. Uniform enhancement is provided across the channel region with little if any encroachment by the halo region. Localization of the halo region reduces the source/drain junction capacitances which, as mentioned above, increases the operating speed of the transistor. Additionally, the artisan will appreciate that the above-described methodologies can be utilized in the context of CMOS fabrication which includes both NMOS and PMOS devices. Moreover, such devices can be formed through utilization of the inventive methodologies in a manner which can permit formation of transistor devices with independent gate oxide thicknesses.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a field effect transistor comprising:

forming a masking layer over a semiconductive substrate;

forming an opening through the masking layer, the opening comprising a pair of sidewalls;

providing both halo doping impurity and lightly doped drain impurity through the opening and into the substrate, the opening sidewalls defining a substrate area in which the halo doping impurity and lightly doped drain impurity is received; and forming a transistor gate within the opening and source/drain diffusion regions within the substrate and operably proximate the halo doping impurity and lightly doped drain impurity, wherein providing the halo doping impurity and the lightly doped drain impurity comprise providing n-type dopants.

2. A method of forming a field effect transistor comprising:

forming a masking layer over a semiconductive substrate;

forming an opening through the masking layer, the opening comprising a pair of sidewalls;

providing both halo doping impurity and lightly doped drain impurity through the opening and into the substrate, the opening sidewalls defining a substrate area in which the halo doping impurity and lightly doped drain impurity is received; and forming a transistor gate within the opening and source/drain diffusion regions within the substrate and operably proximate the halo doping impurity and lightly doped drain impurity, wherein providing the halo doping impurity and the lightly doped drain impurity comprises conducting at least one angled n-type dopant implant.

3. The method of claim 1, wherein forming the masking layer comprises forming a doped polysilicon layer over the substrate and an insulative layer over the doped polysilicon layer.

4. The method of claim 3, wherein forming the polysilicon layer comprises forming ptype polysilicon.

5. The method of claim 3, further comprising:

forming sidewall spacers over the sidewalls of the opening; and providing p-type dopant into the substrate after forming the sidewall spacers.

6. The method of claim 3, wherein forming of the source/drain diffusion regions comprises outdiffusing p-type dopant from the polysilicon layer.

7. The method of claim 6 further comprising removing portions of the masking layer outwardly of a substrate active area in which the transistor gate is formed.

8. The method of claim 1, further comprising providing p-type dopant into the substrate inwardly of substrate portions over which the sidewalls are disposed.

9. The method of claim 8, further comprising, prior to providing the p-type impurity into the substrate, and after providing halo doping impurity and lightly doped drain impurity through the opening and into the substrate, forming sidewall spacers over the opening sidewalls.

10. A method of forming a field effect transistor comprising:

forming a masking layer over a semiconductive substrate;

forming an opening through the masking layer, the opening comprising a pair of sidewalls;

providing both halo doping impurity and lightly doped drain impurity through the opening and into the substrate, the opening sidewalls defining a substrate area in which the halo doping impurity and lightly doped drain impurity is received; and forming a transistor gate within the opening and source/drain diffusion regions within the substrate and operably proximate the halo doping impurity and lightly doped drain impurity, wherein providing the halo doping impurity and the lightly doped drain impurity comprises conducting at least one angled implant.

11. A method of forming a field effect transistor comprising:

forming a masking layer comprising p-type polysilicon over a semiconductive substrate;

forming an opening through the masking layer, the opening comprising a pair of sidewalls;

providing both halo doping impurity and lightly doped drain impurity through the opening and into the substrate, the opening sidewalls defining a substrate area in which the halo doping impurity and lightly doped drain impurity is received;

forming a transistor gate within the opening and source/drain diffusion regions within the substrate and operably proximate the halo doping impurity and lightly doped drain impurity, wherein providing the halo doping impurity and the lightly doped drain impurity comprise providing n-type dopants.

12. A method of forming a field effect transistor comprising:

forming a masking layer comprising p-type polysilicon over a semiconductive substrate;

forming an opening through the masking layer, the opening comprising a pair of sidewalls;

providing both halo doping impurity and lightly doped drain impurity through the opening and into the substrate, the opening sidewalls defining a substrate area in which the halo doping impurity and lightly doped drain impurity is received;

forming a transistor gate within the opening and source/drain diffusion regions within the substrate and operably proximate the halo doping impurity and lightly doped drain impurity, wherein providing the halo doping impurity and the lightly doped drain impurity comprises conducting at least one angled implant.

13. A method of forming a field effect transistor comprising:

forming a masking layer comprising p-type polysilicon over a semiconductive substrate;

forming an opening through the masking layer, the opening comprising a pair of sidewalls;

providing both halo doping impurity and lightly doped drain impurity through the opening and into the substrate, the opening sidewalls defining a substrate area in which the halo doping impurity and lightly doped drain impurity Is received;

forming a transistor gate within the opening and source/drain diffusion regions within the substrate and operably proximate the halo doping impurity and lightly doped drain impurity, wherein providing the halo doping impurity and the lightly doped drain impurity comprises conducting at least one angled implant of a n-type dopant.

14. The method of claim 11, wherein forming the masking layer comprises forming an insulative layer over the p-type polysilicon layer.

15. The method of claim 11, further comprising:

forming sidewall spacers over the sidewalls of the opening; and providing p-type dopant into the substrate after forming the sidewall spacers.

16. A method of forming a field effect transistor comprising:

forming a masking layer comprising p-type polysilicon over a semiconductive substrate;

forming an opening through the masking layer, the opening comprising a pair of sidewalls;

providing both halo doping impurity and lightly doped drain impurity through the opening and into the substrate, the opening sidewalls defining a substrate area in which the halo doping impurity and lightly doped drain impurity is received;

forming a transistor gate within the opening and source/drain diffusion regions within the substrate and operably proximate the halo doping Impurity and lightly doped drain impurity, wherein forming of the source/drain diffusion regions comprises outdiffusing p-type dopant from the polysilicon layer.

17. The method of claim 16 further comprising removing portions of the masking layer outwardly of a substrate active area in which the transistor gate is formed.

* * * * *

UNITED STATES PATENT AND TRADEMARK OFFICE
CERTIFICATE OF CORRECTION

PATENT NO.     : 6,482,691 B2
DATED          : November 19, 2002
INVENTOR(S)    : Zhiqiang Wu et al.

It is certified that error appears in the above-identified patent and that said Letters Patent is hereby corrected as shown below:

Title page, Item [54] and Column 1, line 1,
Replace "SEISMIC IMAGING USING OMNI-AZIMUTH SEISMIC ENERGY SOURCES AND DIRECTIONAL SENSING" with -- METHODS OF FORMING FIELD EFFECT TRANSISTORS AND RELATED FIELD EFFECT TRANSISTOR CONSTRUCTIONS --
Item [57], ABSTRACT,
Line 8, replace, "wall spacers are formed over respective sidewaUs of the" with
-- wall spacers are formed over respective sidewalls of the --

Column 1,
Line 4, insert -- Related Patent Data --

Column 5,
Line 30, replace "halo regions 70, 72 operably proximate source1drain" with
-- halo regions 70, 72 operably proximate source/drain --
Line 53, replace "silicide layer 58a are formed. over substrate 22 and within" with
-- silicide layer 58a are formed over substrate 22 and within --

Column 7,
Line 25, replace "layer comprises forming ptype poysilicon." with -- layer comprises forming p-type polysilicon. --

Column 8,
Line 39, replace "doped drain impurity Is received;" with -- doped drain impurity is received; --

UNITED STATES PATENT AND TRADEMARK OFFICE
CERTIFICATE OF CORRECTION

PATENT NO.     : 6,482,691 B2
DATED          : November 19, 2002
INVENTOR(S)    : Zhiqiang Wu et al.

It is certified that error appears in the above-identified patent and that said Letters Patent is hereby corrected as shown below:

Column 9,
Line 3, replace "proximate the halo doping Impurity and lightly" with -- proximate the halo doping impurity and lightly --

Signed and Sealed this

Twenty-fourth Day of June, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,482,691 B2
DATED : November 19, 2002
INVENTOR(S) : Zhiqiang Wu et al.

It is certified that error appears in the above-identified patent and that said Letters Patent is hereby corrected as shown below:

<u>Title page, item [54], and Column 1, lines 1-3,</u>
Replace "SEISMIC IMAGING USING OMNI-AZIMUTH SEISMIC ENERGY SOURCES AND DIRECTIONAL SENSING"
with -- METHODS OF FORMING FIELD EFFECT TRANSISTORS AND RELATED FIELD EFFECT TRANSISTOR CONSTRUCTIONS --

Item [57], ABSTRACT,
Line 8, replace "wall spacers are formed over respective sidewaUs of the" with -- wall spacers are formed over respective sidewalls of the --

<u>Column 5,</u>
Line 30, replace "halo regions 70, 72 operably proximate source1drain" with -- halo regions 70, 72 operably proximate source/drain --
Line 53, replace "silicide layer 58<i>a</i> are formed. over substrate 22 and within" with -- silicide layer 58<i>a</i> are formed over substrate 22 and within --

<u>Column 7,</u>
Line 25, replace "layer comprises forming ptype polysilicon." with -- layer comprises forming p-type polysilicon. --

<u>Column 8,</u>
Line 39, replace "doped drain impurity Is received;" with -- doped drain impurity is received; --

UNITED STATES PATENT AND TRADEMARK OFFICE
CERTIFICATE OF CORRECTION

PATENT NO. : 6,482,691 B2
DATED : November 19, 2002
INVENTOR(S) : Zhiqiang Wu et al.

It is certified that error appears in the above-identified patent and that said Letters Patent is hereby corrected as shown below:

<u>Column 9,</u>
Line 3, replace "proximate the halo doping Impurity and lightly" with
-- proximate the halo doping impurity and lightly --

Signed and Sealed this

Fifteenth Day of July, 2003

JAMES E. ROGAN
*Director of the United States Patent and Trademark Office*